United States Patent [19]

Davies

[11] Patent Number: 4,960,723

[45] Date of Patent: Oct. 2, 1990

[54] PROCESS FOR MAKING A SELF ALIGNED VERTICAL FIELD EFFECT TRANSISTOR HAVING AN IMPROVED SOURCE CONTACT

[75] Inventor: Robert B. Davies, Tempe, Ariz.

[73] Assignee: Motorola, Inc., Schaumburg, Ill.

[21] Appl. No.: 330,850

[22] Filed: Mar. 30, 1989

[51] Int. Cl.⁵ .......................................... H01L 21/335
[52] U.S. Cl. ...................................... 437/41; 437/203; 437/68; 437/150; 437/238; 437/241; 437/160; 148/DIG. 43; 148/DIG. 126; 148/DIG. 103; 148/DIG. 147
[58] Field of Search ...................... 437/200, 44, 45, 38, 437/203, 41, 68, 150, 29, 238, 240, 241, 160; 156/653, 657, 661.1; 148/DIG. 43, DIG. 103, DIG. 126, DIG. 147

[56] References Cited

U.S. PATENT DOCUMENTS

| | | | |
|---|---|---|---|
| 4,407,058 | 10/1983 | Fatula, Jr. et al. | 437/38 |
| 4,503,598 | 3/1985 | Vola et al. | 437/203 |
| 4,593,302 | 6/1986 | Lidow et al. | 357/23.4 |
| 4,644,637 | 2/1987 | Temple | 437/41 |
| 4,735,680 | 4/1988 | Yen | 156/643 |
| 4,753,897 | 6/1988 | Lund et al. | 437/41 |

OTHER PUBLICATIONS

Mori et al., "An Insulated Gate . . . ", *IEEE IEDM Technical Digest,* 1988, pp. 813–816.

*Primary Examiner*—Brian E. Hearn
*Assistant Examiner*—Tin Quach
*Attorney, Agent, or Firm*—Joe E. Barbee; Stuart T. Langley

[57] ABSTRACT

An improved method for making a self-aligned vertical field effect transistor is provided wherein a nitride sidewall spacer is formed around a polysilicon gate, and an oxide sidewall spacer, which may be heavily doped with an n-type dopant, is formed covering the silicon nitride sidewall spacer. The silicon nitride sidewall spacer allows the oxide sidewall spacer of a conventional self-aligned vertical field effect transistor process to be removed partially or completely before making ohmic contact to the source thus increasing the contact area between the source and the source electrode and eliminating reliability problems related to n-type doped oxide in contact with aluminum electrodes.

7 Claims, 1 Drawing Sheet

PROCESS FOR MAKING A SELF ALIGNED VERTICAL FIELD EFFECT TRANSISTOR HAVING AN IMPROVED SOURCE CONTACT

BACKGROUND OF THE INVENTION

The present invention relates, in general, to vertical field effect transistors. More particularly, the invention relates to self-aligned vertical field effect transistors having an improved source contact area.

Vertical field effect transistors, also called double diffused MOSFETs (DMOS) are well known. These devices include a p-type base region and an n-type source region diffused through a single window defined by an edge of a polysilicon gate. The source region is completely contained within the base region, so that a portion of both the source and base regions extends beneath the gate. A channel region is thus formed beneath the gate between the lateral boundaries of the source region and the base region. To improve performance, a source electrode must be made to contact both the source region and the base region. Performance is further improved by doping the portion of the base region underneath the source contact more heavily than the channel region.

Cost of manufacture of vertical field effect transistors is proportional to size of the transistor, number of mask steps required to produce the transistor, and overall yield of good devices. One method of reducing the number of mask steps required is to use a self-aligned process, whereby elements of the transistor are defined by deposition, diffusion, and etching processes but not by photoresist alignment processes. An advantage of the self-aligned process is that all critical elements are aligned to the polysilicon gate without mask registration error, which reduces yield loss due to misalignment. Self-aligned manufacturing processes lower cost by reducing the labor and overhead associated with the alignment processes, and by allowing smaller dimensions, resulting in smaller size of the transistor.

A previous self-aligned vertical field effect transistor process was described by Mutsuhio Mori et al. in "An insulated gate bipolar transistor with a self-aligned DMOS structure", IEDM 88-813, 1988. In this structure, a phosphosilicate oxide sidewall spacer was used to form the n-type source region and to isolate the gate from the source electrode. The n-type source region diffused laterally from the edges of the phosphosilicate oxide sidewall spacer, diffusing on one side beneath the gate to define the channel region, and diffusing on the other side to create a contact area for the source contact. The phosphosilicate oxide served also to isolate the source electrode from the polysilicon gate.

To fabricate a low on-resistance vertical field effect transistor it is important that the contact between the source electrode and the source region be a low resistance contact. Contact resistance is a function of contact area between the source region and the source electrode and doping density of the source region. Previous self-aligned processes such as the process described in the Mori et al. article, defined the contact area completely by the lateral diffusion of dopant from the phosphosilicate oxide, as described above. This lateral diffusion was often too small to make a low resistance ohmic contact. One possible solution to this problem was to increase the size of the source region, which had the undesired effect of increasing size of the transistor. Another solution was to isotropically etch the phosphosilicate oxide to expose more of the underlying source region, but due to the high dopant concentration of the phosphosilicate oxide controlled isotropic etching was difficult. Thus, a process for manufacturing self-aligned vertical field effect transistors with an improved contact area between the source region and the source electrode is needed.

To obtain a high source doping density, the phosphosilicate oxide must contain a high concentration of phosphorous. Also, aluminum electrodes are usually used to make electrical contact to the source region. It is known, however, that corrosion results when aluminum electrodes are placed in contact with oxides having a high concentration of phosphorous. In order to improve the reliability of the transistor, the phosphosilicate oxide must not contact the source electrode.

Accordingly, it is an object of the present invention to provide an improved method for manufacturing a self-aligned vertical field effect transistor.

It is a further object of the present invention to provide a self-aligned vertical field effect transistor with improved yield.

It is a further object of the present invention to provide an improved self-aligned vertical field effect transistor which is lower in cost.

It is a further object of the present invention to provide an improved self-aligned vertical field effect transistor with improved reliability.

It is still a further object of the present invention to provide a self-aligned vertical field effect transistor with improved process control.

SUMMARY OF THE INVENTION

The above and other objects and advantages of the present invention are achieved by providing a self-aligned vertical field effect transistor wherein a nitride sidewall spacer is formed around a polysilicon gate, and an oxide sidewall spacer, which may be heavily doped with an n-type dopant, is formed covering the silicon nitride sidewall spacer. The silicon nitride sidewall spacer allows the oxide sidewall spacer of a conventional self-aligned vertical field effect transistor process to be removed partially or completely before making ohmic contact to the source thus increasing the contact area between the source and the source electrode and eliminating reliability problems related to heavily doped oxide in contact with aluminum electrodes.

DETAILED DESCRIPTION OF THE DRAWINGS

Figure 1:
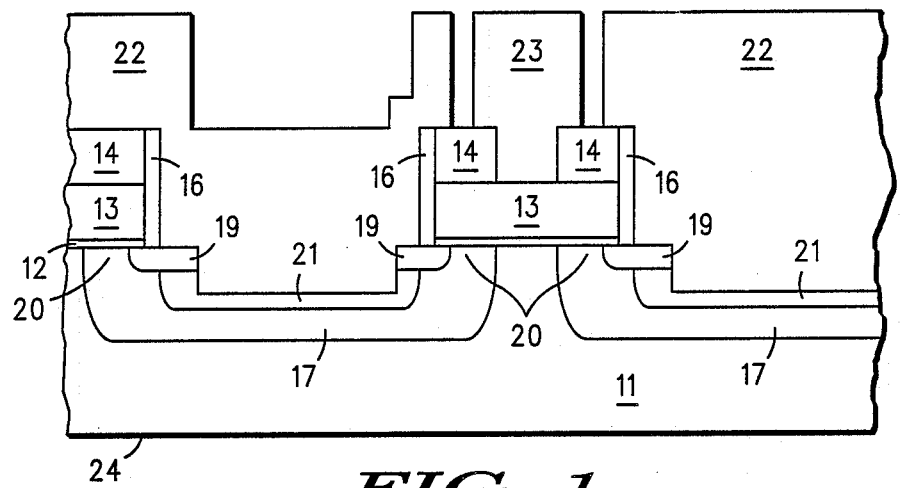
FIG. 1 illustrates an enlarged cross-sectional view of a vertical field effect transistor embodying the present invention processed through metallization.

FIG. 1 illustrates a cross sectional view of the present invention after processing through metallization. The DMOS field effect transistor includes a plurality of cells similar to that shown in FIG. 1 coupled in parallel. Gate oxide 12 and polysilicon gate 13 are formed on substrate 11, and covered with silicon dioxide layer 14. Gate oxide 12, polysilicon gate 13, and oxide layer 14, are anisotropically etched to form a gate region. Base region 17 is formed by ion implantation and diffusion of impurities after the anisotropic etch of layers 12, 13, and 14. The formation and function of nitride sidewall spacer 16, source 19, and low resistivity region 21 are discussed in greater detail hereinafter. A portion of base region 17 that interfaces with gate oxide layer 12 between source region 19 and the undoped portion of substrate 11 is channel region 20. Source electrode 22 is formed in contact with source region 19 and low resistivity region 21. Gate electrode 23 is formed in contact with polysilicon gate 13. Drain electrode 24 is formed in contact with substrate 11, whereby current flows from drain contact 24 through substrate 11, through channel region 20, to source region 19 and source electrode 22, when gate electrode 23 is energized. The length of channel region 20 is an important determinate of the characteristics of the vertical field effect transistor and must be controlled carefully to maintain breakdown voltage and low on resistance of the transistor.

Figure 2:
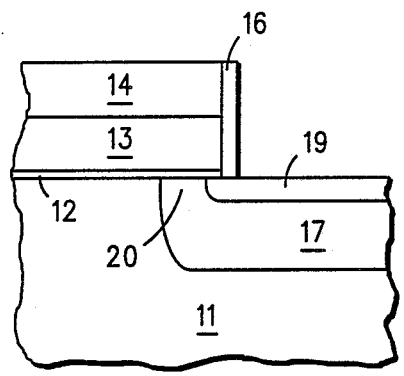
FIG. 2 illustrates an enlarged cross sectional view of a first embodiment of the invention of FIG. 1 partially through processing.

FIG. 2 illustrates an enlarged cross-sectional view of a portion of the structure of FIG. 1 showing a first embodiment of the present invention processed through source diffusion. Silicon nitride sidewall spacer 16 is formed on an edge of the gate region, by depositing a silicon nitride layer covering at least the top of oxide layer 14 and an edge of oxide layer 14, polysilicon gate 13, and gate oxide 12. The silicon nitride layer is anisotropically etched, removing the silicon nitride on top of oxide layer 14 leaving only sidewall spacer 16. In this first embodiment, source region 19 is formed by ion implantation and subsequent diffusion after formation of silicon nitride sidewall spacer 16, so that a portion of source region 19 extends beneath the gate region. Source layer 19 could also be formed before forming nitride sidewall spacer 16, and is preferably formed by ion implantation before formation of nitride sidewall 16 and diffusion after formation of nitride sidewall spacer 16. In this preferred method, nitride sidewall 16 covers a portion of source 19 and also serves to protect gate oxide 12 from ionic contamination and further oxidation during the thermal diffusion of source 19.

Figure 3:
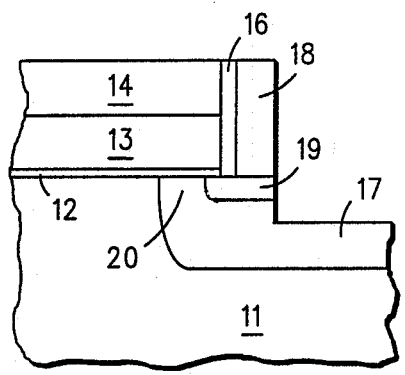
FIGS. 3-4 illustrate enlarged cross-sectional views of the present invention at various stages of fabrication using either the first or a second embodiment of the present invention.

FIG. 3 illustrates a cross-sectional view of the present invention after further processing. Oxide sidewall spacer 18 is formed adjacent to nitride sidewall spacer 16 covering a portion of source region 19. Portions of source region 19 and base region 17 are anisotropically etched using oxide sidewall spacer 18 as a mask to remove the portion of source layer 19 which is not protected by oxide sidewall spacer 18, thus exposing a portion of base region 17 at the surface of the device.

Figure 4:
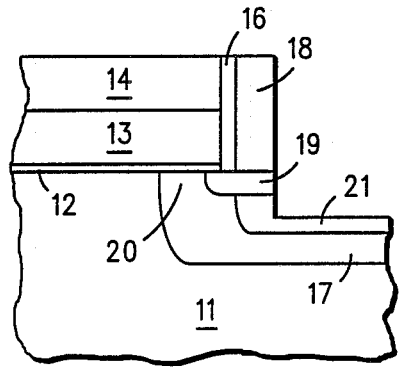

FIG. 4 illustrates the device after formation of low resistivity region 21. Low resistivity region 21 is diffused so as to extend beneath a significant portion of source 19 but not extending laterally into channel region 20 nor vertically beyond the boundaries of base region 17. A parasitic bipolar transistor is formed by source region 19, which acts as an emitter, base region 17, which acts as a base, and substrate 11, which acts as a collector. Safe operating area of the DMOS transistor is limited by the parasitic bipolar transistor. Low resistivity region 21 serves to reduce gain and base resistance of the parasitic bipolar transistor, thus extending the safe operating area of the transistor. One method of forming low resistivity region 21 is to implant ions of the same conductivity type as base 17 into the exposed silicon using oxide sidewall spacer 18 as a mask. In a preferred embodiment, a boron silicide layer (not shown) is selectively formed on all exposed silicon surfaces after removal of the exposed portion of source region 19, and serves as a boron source for the formation of low resistivity region 21. Boron from the boron silicide layer is thermally diffused into base 17, and diffuses laterally underneath source 19 to form low resistivity region 21. The boron silicide layer is removed before subsequent processing.

Referring again to FIG. 1, after formation of low resistivity region 21, oxide sidewall spacer 18 is removed. Silicon nitride sidewall spacer 16 protects gate oxide 12, polysilicon gate 13, and channel region 20 from contamination during removal of oxide sidewall spacer 18. Removal of oxide sidewall spacer 18 uncovers a portion of source region 19 which serves as a source contact area. The source contact area is thus controlled by the width of oxide sidewall spacer 18. In addition, forming the source contact area by removing oxide sidewall spacer 18 solves the contact area problem discussed in regard to the Mori et al article. In addition to providing a larger source contact area, the source diffusion process described hereinbefore is performed to result in an optimum length of channel region 20 without affecting the contact area.

Figure 5:
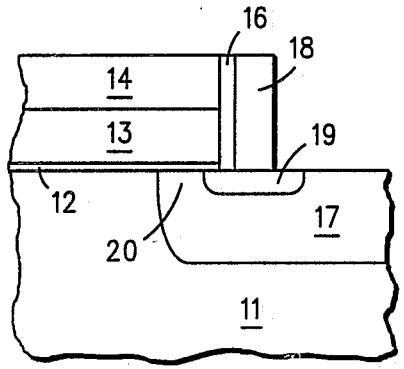
FIG. 5 illustrates an enlarged cross-sectional view of the second embodiment of the present invention partially through processing.

Referring now to FIG. 5, which illustrates a second embodiment of the present invention, oxide sidewall spacer 18 is formed prior to formation of source region 19. Oxide sidewall spacer 18 may be formed of a phosphosilicate oxide, or otherwise heavily doped with an n-type dopant. Source region 19 is formed by diffusing the n-type dopant in the oxide sidewall spacer 18 into base region 17 so that a portion of source region 19 extends beneath the gate region. Subsequent processing of the device to completion is similar to that of the first embodiment described hereinbefore. It should be noted that oxide sidewall spacer 18 is removed prior to formation of source electrode 22 shown in FIG. 1, which eliminates any possibility of corrosion caused by the high concentration of phosphorus in oxide sidewall spacer 18.

By now it should be appreciated that an improved self-aligned vertical field effect transistor has been provided wherein the source contact area is controlled independent of other processes. Improved process control leads to improved yield and lower cost devices. The vertical field effect transistor provided allows smaller lateral dimensions of the source region than previous self-aligned processes and thus lower material costs. Additionally, the vertical field effect transistor provided reduces the possibility of contamination of the gate region, and eliminates highly doped phosphorus oxide in the finished product, which results in higher reliability and longer lifetime of the device.

I claim:

1. An improved method for making a vertical field effect transistor having a silicon substrate which serves as a drain, a polysilicon gate formed on one surface of the silicon substrate, and a source formed in the silicon substrate, the improvement comprising the steps of: forming a silicon nitride sidewall spacer covering an edge of the gate; forming an oxide sidewall spacer covering the silicon nitride sidewall spacer; etching a portion of the source using the oxide sidewall spacer as an etch mask thereby producing an exposed portion of the silicon substrate; and removing the oxide sidewall spacer.

2. The method of claim 1 wherein the oxide sidewall spacer is doped with a dopant of the same conductivity type as the source.

3. The method of claim 2 further comprising the step of diffusing the dopant from the oxide sidewall spacer into the silicon substrate to form the source.

4. The method of claim 1 wherein the step of etching a portion of the source comprises an anisotropic etch.

5. The method of claim 1 further comprising the step of forming a low resistivity region of a different conductivity type than the source in the exposed portion of the silicon substrate using the oxide sidewall spacer as a mask.

6. The method of claim 1 further comprising the steps of: selectively forming a boron silicide layer on the exposed portion of the silicon substrate; forming a low resistivity region in the silicon substrate by diffusing boron from the boron silicide layer into the substrate; and removing the boron silicide layer.

7. The method of claim 1 further including the step of forming a source electrode in contact with the source wherein the silicon nitride sidewall spacer insulates the source electrode from the polysilicon gate.

* * * * *